United States Patent
Giacomini

(10) Patent No.: US 8,860,517 B2
(45) Date of Patent: Oct. 14, 2014

(54) OSCILLATOR CIRCUT AND ELECTRONIC CIRCUIT COMPRISING THE OSCILLATOR CIRCUIT

(75) Inventor: Mauro Giacomini, Bergamo (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 64 days.

(21) Appl. No.: 13/524,510

(22) Filed: Jun. 15, 2012

(65) Prior Publication Data

US 2012/0326796 A1    Dec. 27, 2012

(30) Foreign Application Priority Data

Jun. 27, 2011  (IT) .............................. MI2011A1166

(51) Int. Cl.
*H03K 3/0231* (2006.01)
*H03K 3/354* (2006.01)
*H03K 3/011* (2006.01)

(52) U.S. Cl.
CPC .............. *H03K 3/0231* (2013.01); *H03K 3/354* (2013.01); *H03K 3/011* (2013.01)
USPC ............................ 331/111; 331/143; 331/175

(58) Field of Classification Search
USPC .......... 331/111, 143, 144, 113 R, 177 R, 175, 331/78
See application file for complete search history.

(56) References Cited

U.S. PATENT DOCUMENTS

| | | | |
|---|---|---|---|
| 4,705,961 | A | 11/1987 | Ainsworth et al. |
| 6,400,232 | B1 | 6/2002 | Good et al. |
| 7,034,627 | B1 | 4/2006 | Kudari |
| 7,420,431 | B2 * | 9/2008 | Hwang et al. ................. 331/143 |
| 7,504,897 | B2 * | 3/2009 | Chava et al. ..................... 331/78 |
| 7,800,454 | B2 * | 9/2010 | Vanselow et al. ........... 331/36 C |
| 8,421,431 | B2 * | 4/2013 | Chia ............................. 323/288 |
| 2009/0160521 | A1 | 6/2009 | Elran |
| 2010/0013566 | A1 | 1/2010 | Kim |
| 2012/0182080 | A1 * | 7/2012 | Sinitsky et al. ............... 331/143 |
| 2013/0200956 | A1 * | 8/2013 | Hsiao ............................ 331/111 |

FOREIGN PATENT DOCUMENTS

WO    WO 9322833 A1    11/1993

OTHER PUBLICATIONS

Italian Search Report and Written Opinion dated Feb. 23, 2012 from corresponding Italian Application No. MI20111166.

* cited by examiner

*Primary Examiner* — Ryan Johnson
(74) *Attorney, Agent, or Firm* — Allen, Dyer, Doppelt, Milbrath & Gilchrist, P.A.

(57) ABSTRACT

An oscillator circuit including a first capacitor provided with a first terminal; a resistor provided with a reference terminal; a first current generator provided with a connection terminal; a second current generator provided with a second connection terminal. Further, the circuit includes a switching matrix between the first and second generators and resistor and the at least one first capacitor.

16 Claims, 10 Drawing Sheets

OSCILLATOR CIRCUT AND ELECTRONIC CIRCUIT COMPRISING THE OSCILLATOR CIRCUIT

CROSS REFERENCE TO RELATED APPLICATIONS

This application claims the priority benefit of Italian patent application number MI2011A001166, filed on Jun. 27, 2011, which is hereby incorporated by reference to the maximum extent allowable by law.

BACKGROUND

1. Technical Field

Embodiments relate to RC-type oscillator circuits used for generating clock signals, for example pulsed-type signals. Particularly, embodiments relate to oscillator circuits formed by an integrated electronic circuit in a chip made of a semiconductor material.

2. Discussion of the Related Art

RC-type oscillator circuits formed by an integrated circuit made of a semiconductor material, capable of generating a clock signal, using internal resistors and capacitors, that is integrated in the same chip, are known. Such RC-type oscillators neither use inner or outer inductors nor outer crystals. In the automotive field, the RC oscillators are used in the electronic systems in order to generate frequencies in the range of 100 kHz-100 MHz.

Document US-A-2010/0013566 describes a RC-type oscillator comprising a resistor and two capacitors. The two capacitors are alternatively charged by currents generated by a current mirror and are alternatively discharged. The RC oscillator circuit, described in this document, is provided with a sensing unit generating an impulse of the clock signal each time the voltage across one of the two capacitors exceeds a logic threshold level.

Referring to the known RC oscillators, the Applicant has observed that the generated clock experiences an undesired frequency shift with respect to a project nominal value. This undesired translation is for example caused by the manufacturing process of the corresponding integrated circuit. Particularly, the Applicant has noted that a first contribution to the frequency shift is present in the circuit integrated in the silicon die (in the wafer state) before the step of packaging the die itself. This contribution can be generally compensated by a process of calibrating the circuit itself.

Whereas, a second contribution to the frequency shift is determined by mechanical stresses associated with the steps of cutting the silicon die from the wafer and with the following packaging step. The compensation of this second contribution, for example by a further step of calibrating the circuit provided with a package, apart from being complex and expensive, could be disappointing.

SUMMARY

The Applicant has observed that it is possible to obtain advantages with reference to the reduction of the frequency shift induced by the manufacturing process with respect to the known oscillator circuits, by implementing an oscillator circuit as defined by claim 1.

The dependent claims define other possible embodiments of the oscillator circuit.

Claim 16 defines an electronic system comprising an oscillator circuit.

In particular, there is provided an oscillator comprising at least one first capacitor provided with a first terminal, a resistor provided with a reference terminal, a first current source provided with a connection terminal, a second current source provided with a second connection terminal, a switching matrix interposed between the first and second source and the resistor and the at least one first capacitor and configured to selectively connect each between the first and second connection terminals to the first terminal and to the reference terminal.

BRIEF DESCRIPTION OF THE DRAWINGS

For better understanding the embodiments and their advantages, in the following some non-limiting embodiments will be described, with reference to the annexed drawings, wherein.

DETAILED DESCRIPTION

Electronic System

Figure 1:
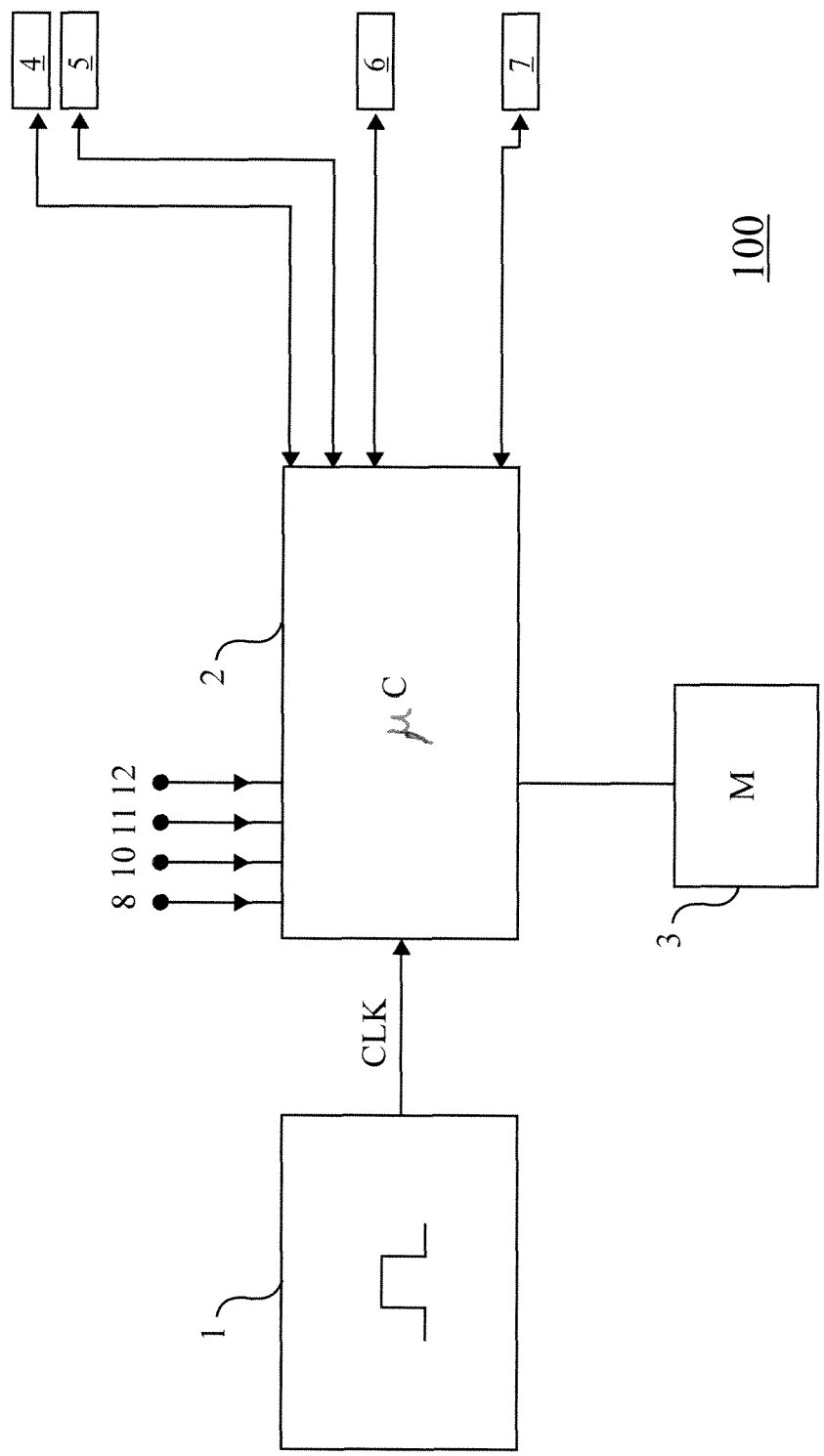
FIG. 1 schematically shows an electronic system, useable in the automotive field, comprising an oscillator circuit.

FIG. 1 shows an embodiment of an electronic system 100 useable, for example, for managing the functionalities of a motor vehicle such as, particularly, the anti-lock braking system (ABS), airbags, lights, system of injectors in diesel engines, of the gasoline engines, and also of the traction control.

It is to be observed that the electronic system 100 can be also used in applications other than those managing the functionalities of a motor vehicle or in the field of microcontrollers used in the industrial sector.

The electronic system 100, of FIG. 1, comprises: a processing and control electronic module 2 (μC), such as for example a microcontroller, a RC-type oscillator circuit 1 configured for supplying a timing or clock signal CLK to the microcontroller 2. For example, such clock signal CLK is a pulses train having a frequency in the range of 100 kHz to 100 MHz.

Further, the microcontroller 2 is connected to a memory module 3 (M) and to a plurality of actuator modules, such as for example: an airbag module 4, an anti-lock brake system module (ABS) 5, a lights module 6 and a fuel injector module 7.

The microcontroller 2 is further provided with a plurality of input ports 8-12, configured for receiving sensing signals which can be generated by the actuator modules 4-7 or other injector devices.

The microcontroller 2, timed by the clock signal CLK generated by the oscillator 1 and based on the sensing signals received at the input ports 8-12, runs a program resident in its internal memory and generates corresponding control signals which are supplied to the plurality of actuator modules 4-7.

Figure 2:
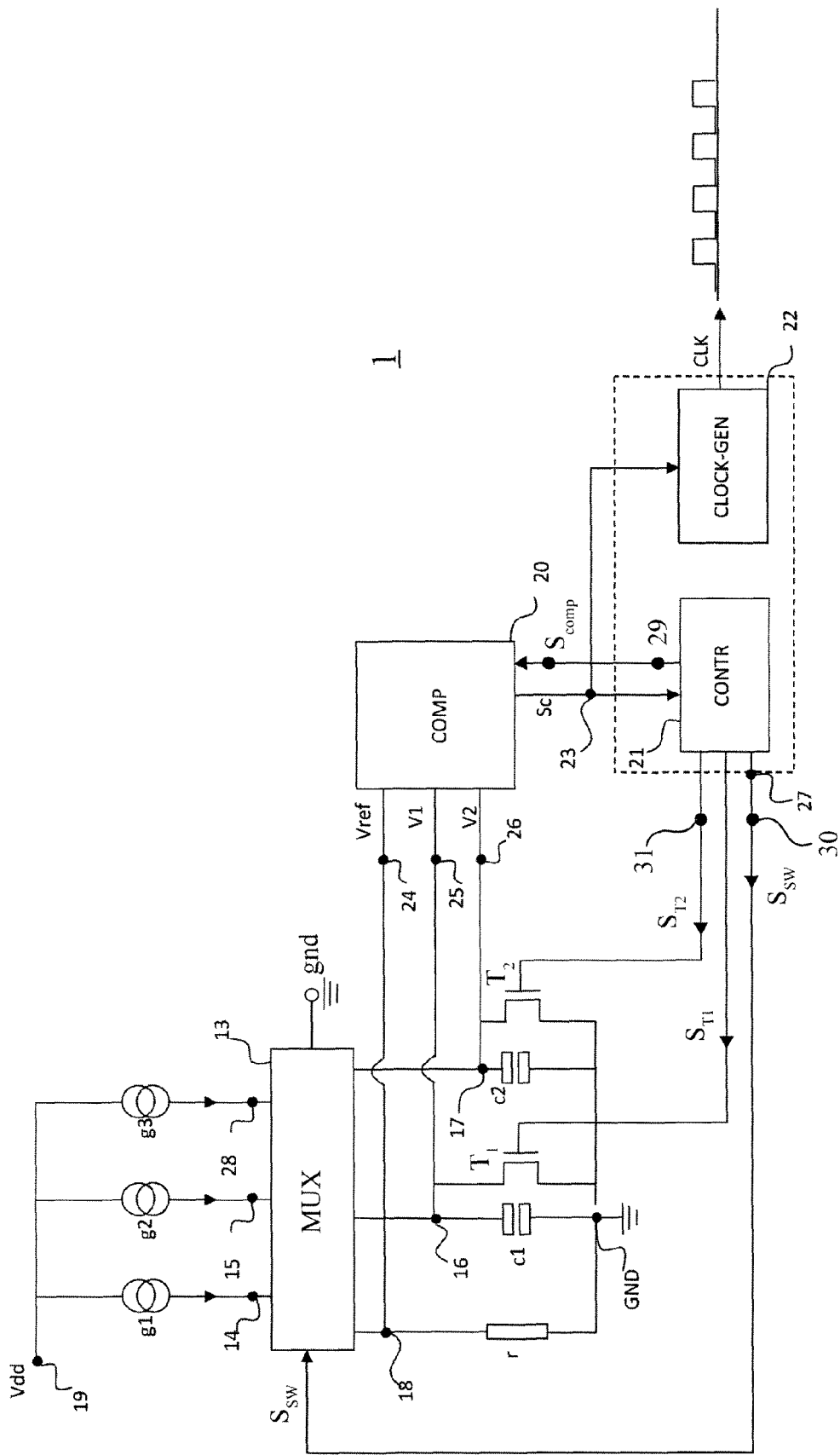
FIG. 2 shows a first embodiment of the oscillator circuit shown in FIG. 1.

Oscillator Circuit 1 of FIG. 2

FIG. 2 illustrates a first embodiment of the oscillator circuit 1, which comprises a first current generator g1, a second current generator g2, a third current generator g3, a switching matrix 13 (MUX), a resistor r, a first capacitor c1, and a second capacitor c2.

The first current generator g1 is provided with a first connection terminal 14 connected to a first input of the switching matrix 13. The second current generator g2 is provided with a second connection terminal 15 connected to a second input of the switching matrix 13. The third current generator g3 is provided with a third connection terminal 28 connected to a third input of the switching matrix 13.

Moreover, the first, second and third current generators g1, g3 and g3 are provided with a further corresponding terminal connected to a supply terminal 19 for receiving a supply voltage Vdd.

The first capacitor c1, having a nominal capacity C, is provided with a first terminal 16 connected to a first output of the switching matrix 13.

The second capacitor c2, having a nominal capacity C, is provided with a second terminal 17 connected to a second output of the switching matrix 13.

According to a specific embodiment shown in FIG. 2, the oscillator circuit 1 further comprises a first discharge transistor T1, for example a NMOS-type transistor, parallelly connected to the first capacitor c1. Particularly, the generator terminal of the first discharge transistor T1, is connected to the first terminal 16, the associated drain terminal is connected to the ground terminal gnd, while the associated gate terminal is driven by a first control signal ST1.

Moreover, the oscillator circuit 1 comprises a second discharge transistor T2, for example a NMOS-type transistor, parallelly connected to the second capacitor c2. Particularly, the generator terminal of the second discharge transistor T2 is connected to the second terminal 17, the associated drain terminal is connected to the ground terminal gnd, while the associated gate terminal is driven by a second control signal ST2.

The resistor r, having a nominal resistance R, is provided with a third terminal 18 connected to a third output of the switching matrix 13. Further terminals of the first capacitor c1, of the second capacitor c2 and of the resistor r are connected to a ground terminal gnd.

The switching matrix 13 is configured for taking several connection configurations as a function of a plurality of control signals Ssw.

Particularly, the switching matrix 13 is configured for selectively connecting the first connection terminal 14 to the first, second and third terminals 16-18; further, the switching matrix 13 enables selectively connecting the second connection terminal 15 to the first, second and third terminals 16-18. Analogously, the switching matrix 13 enables selectively connecting the third connection terminal 28 to the first, second and third terminals 16-18.

According to a particular example, the switching matrix 13 is also configured for enabling a selective connection to the ground terminal gnd of the first g1, second g3 and third current generators g3.

In these different configurations, the first and second capacitors c1, c2 are selectively supplied by the first, second, or third current generators g1, g2 and g3. Moreover, these different configurations determine charge and discharge periods of the first and second capacitors, c1 and c2 with corresponding trends of a first voltage V1, available at the first terminal 16, and of a second voltage V2, available at the second terminal 17.

The different connection configurations further cause the resistor r being supplied by a current, so that a corresponding voltage Vref, available at the third terminal 18, is generated.

Further, the oscillator circuit 1 comprises a comparison module 20 (COMP), a control module 21 (CONTR) and a clock generating module 22 (CLOCK-GEN).

The comparison module 20 is configured for comparing a reference signal with a signal to be compared, and generating at one or more output terminals 23 corresponding comparison signals Sc, for example binary signals, representing the result of the comparison. For example, the comparison module 20 generates a comparison signal Sc having a low level voltage if the reference signal has a value greater than the signal to be compared. The comparison module 20 generates a comparison signal Sc having a high level if the reference signal has a value equal to or lower than the signal to be compared.

Particularly, the comparison module 20 is provided with a reference input 24, connected to the third terminal 18, a first input 25 connected to the first terminal 16, and a second input 26 connected to the second terminal 17.

The control module 21 is configured for generating the plurality of control signals Ssw available at one or more first control terminals 27 and to be supplied to the switching matrix 13, as a function of the comparison signal Sc and a control law. According to the example shown in FIG. 2, the control module 21 is further configured for generating a comparator control signal Scomp, at a second control terminal 29.

Further, according to a particular embodiment, the control module 21 is configured in order to generate the first control signal ST1 at the gate of the first transistor T1, available at a third control terminal 30, and the second control signal ST2 at the gate of the second transistor T2, available at a fourth control terminal 31.

The control module 21, implementing a state machine, can be a software and/or hardware module. The state machine implemented by the control module 21 is such to perform the plurality of configurations of connection to the switching matrix 13, according to a timing clocked by the comparison signal Sc available at the output terminal 23.

The clock generation module 22 is configured for generating the clock signal CLK from the comparison signal Sc (as shown in FIG. 2) and/or from a signal supplied by the control module 21, obtained by the comparison signal Sc.

Particularly, the clock signal CLK is a pulsed square-wave signal, having a period multiple of a base period defined by the comparison signal Sc itself. For example, the clock generation module 22 is hardware implementable by means of digital modules, such as counters, flip-flops, and logic gates by a known technology.

The oscillator circuit 1 is implementable by integration in a semiconductor material die. The first, second and third current generators g1, g2, g3 are obtainable by M55 technology (that is a CMOS-type technology with a 55 nm lithography), known to persons skilled in the field.

Particularly, the switching matrix 13 can comprise a plurality of switches including MOS transistors. Moreover, the resistor r is, for example, made of unsalicided polycrystalline silicon, while the first and second capacitors c1, c2 can be made, for example, by capacity metallization.

The control module 21 and/or the clock generation module 22 can be made by CMOS technology.

Operation of the Oscillator Circuit 1 of FIG. 2

In the following, an example of the oscillator circuit 1 operation will be described.

According to this example, the first, second, and third current generators g1-g3 are supplied by a nominal current I0. As is known to the person skilled in the field, in order to compensate undesired effects associated with the manufacturing process of the oscillator circuit 1, the first, second, and third current generators can generate corresponding actual currents I1, I2, I3 having a value different from the nominal one I0.

The variation of the actual current generated by each current generators g1-g3 can be described by the following offset coefficients:

$$\alpha = I1/I0; \beta = I2/I0; \delta = I3/I0. \quad (1)$$

Further, in the exemplifying described operation, the control module 21 iteratively implements the following configurations sequence of connection to the switching matrix 13:

I. The first current generator g1 is connected to the third terminal 18 of resistor r; the second generator g2 is connected to the first terminal 16 of the first capacitor c1; the third generator g3 is connected to the ground terminal gnd;

II. The second current generator g2 is connected to the third terminal 18 of the resistor r; the third generator g3 is connected to the second terminal 17 of the second capacitor c2; the first generator g1 is connected to the ground terminal gnd;

III. The third current generator g3 is connected to the third terminal 18 of the resistor r; the first generator g1 is connected to the first terminal 16 of the first capacitor c1; the second generator g2 is connected to the ground terminal gnd;

IV. The third current generator g3 is connected to the third terminal 18 of the resistor r;
the second generator g2 is connected to the second terminal 17 of the second capacitor c2; the first generator g1 is connected to the ground terminal gnd;

V. The second current generator g2 is connected to the third terminal 18 of the resistor r; the first generator g1 is connected to the first terminal 16 of the first capacitor c1; the third generator g3 is connected to the ground terminal gnd;

VI. The first current generator g1 is connected to the third terminal 18 of the resistor r; the third generator g3 is connected to the second terminal 17 of the second capacitor c2; the second generator g2 is connected to the ground terminal gnd.

It is to be observed that in each connection configurations I-VI of the switching matrix 13, just one of the two between the first and second capacitors c1, c2 is supplied by a corresponding current generator g1-g3, while the other has a discharging electric configuration. For example, in the connection configuration III, the first capacitor c1 charges, while the second capacitor c2 discharges dropping to a zero voltage value; in the next configuration IV, the second capacitor c2 will be connected to the second current generator g2 in order to enable the charge of the same from the zero initial voltage value taken at the end of the discharging period in the configuration III.

Moreover, in the connection configurations comprising steps of charging the first capacitor c1, such steps are alternatively performed by the first current generator g1, second current generator g2 and third current generator g3. Similarly, the different connection configurations comprising the step of charging the second capacitor c2 are alternatively performed by the first current generator g1, second current generator g2, and third current generator g3.

During the connection configuration III, the first control signal ST1, assuming, according to the example, a high value, drives the opening (that is, deactivates the conduction) of the first discharge transistor T1, enabling the charge of the first capacitor c1, while the second control signal ST2, assuming, according to the example, a low value, drives the closure of the second discharge transistor T2, enabling the discharge of the second capacitor c2.

Thanks to the above description of the example regarding the specific connection configuration III, it is to be understood by the person skilled in the field, that for each of the possible connection configurations I-VI, there are corresponding values of the first and second control signals ST1, ST2, and consequent states of the first and second discharge transistors T1 and T2.

Further, it is to be noted that when the first current generator g1 (supplying the actual current I1) is connected to the resistor r, the third terminal 18 is at a reference voltage Vref equal to the first reference value Vref1=I1×R.

Analogously, when the second current generator g2 (supplying an actual current I2) is connected to the resistor r, the third terminal 18 is at a reference voltage Vref equal to the second reference value Vref2=I2×R.

When the third current generator g3, supplying an actual current I3, is connected to the resistor r, the third terminal 18 is at a reference voltage Vref equal to a third reference value Vref3=I3×R.

Figure 3:
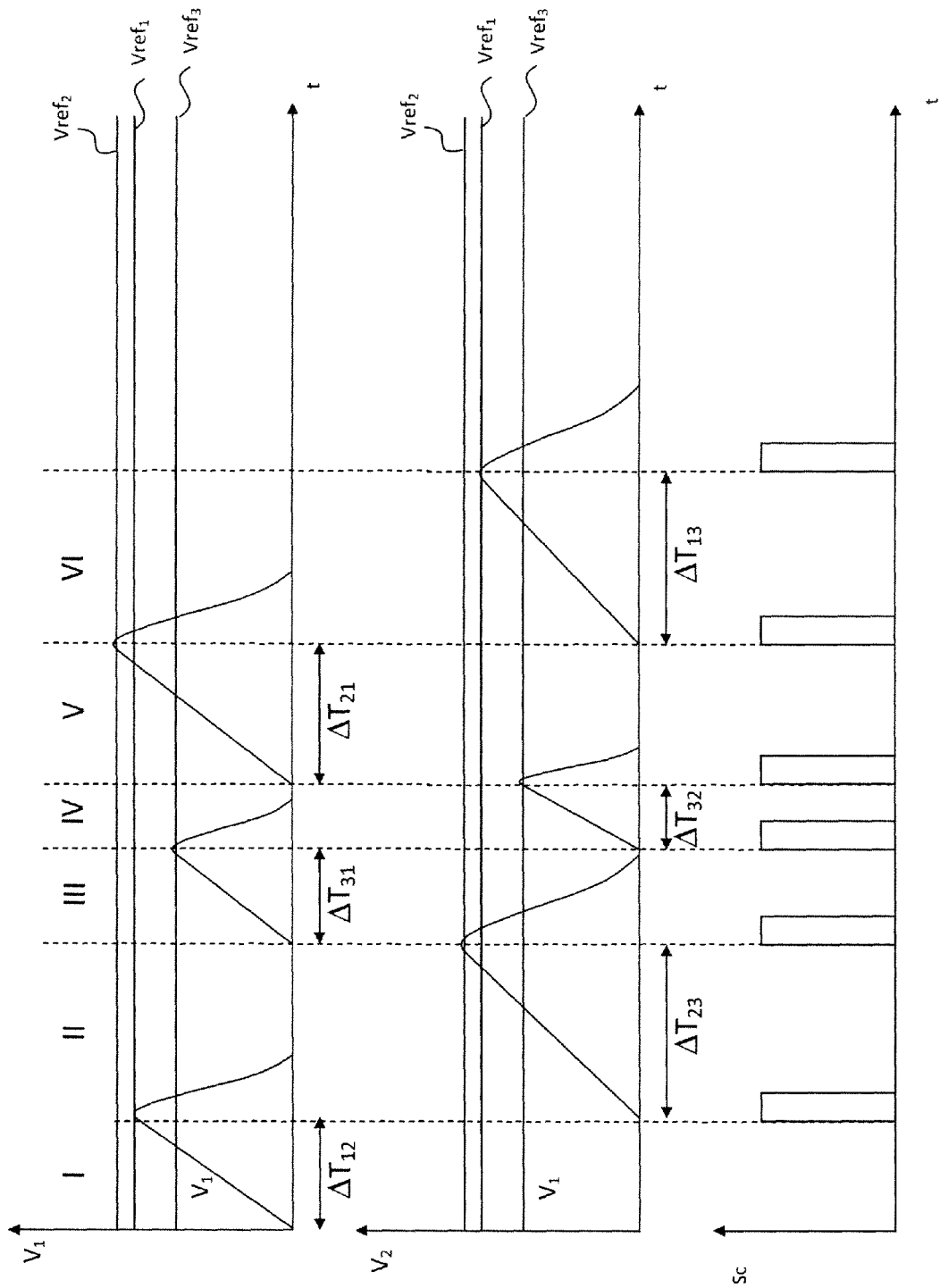
FIG. 3 shows an exemplifying trend of some signals of the first embodiment of said oscillator circuit.

Further, with reference to FIG. 3, in configuration I, the resistor r, connected to the first current generator g1 supplying an actual current I1, develops a voltage at the third terminal 18 equal to the first value Vref1. In this configuration I, the second current generator g2 supplies the first capacitor c1 which charges by taking a first voltage V1 available at the first terminal 16 having an increasing trend, according to this example, and schematically shown with a linear trend as shown in FIG. 3. In the same connection configuration I, the comparison module 20 compares the first reference value Vref1 and the first voltage V1 and supplies a comparison signal Sc.

As long as the value of the first voltage V1 is less than the first reference value Vref1, the comparison module 20 returns a comparison signal Sc having a low value, as shown in FIG. 3. When the first voltage V1 value equals the first reference value Vref1, the comparison signal Sc switches to a high value.

The quantity $\Delta T_{12}$ is the time range between the initial activation time of the connection configuration I and the switching instant of the comparison signal Sc.

As the comparison signal Sc switches to the high value, the control module 21, by performing the control law, generates the plurality of control signals Ssw, in order to drive the switching matrix 13 to the connection configuration II.

Moreover, as the comparison signal Sc switches to the high value, the control module 21 generates the comparator control signal Scomp, available at a terminal 29, by this, the comparison module 20 is configured for comparing the signal Vref at the reference input 24, with the second voltage V2 available at the second input 26.

In the connection configuration II, since the resistor r is connected to the second current generator g2, generating an actual current I2, develops a voltage at the third terminal 18 equal to the value Vref2. In the connection configuration II, the third current generator g3 supplies the second capacitor c2, which in turn charges by taking a second voltage V2 available at the second terminal 17, having an increasing trend, according to this example, and schematically shown by a linear trend as illustrated in FIG. 3. In the same connection configuration II, the comparison module 20 compares the second reference value Vref2 and the second voltage V2.

As long as the second voltage V2 is lower than the second reference value Vref2, the comparison module 20 returns a comparison signal Sc having a low value, as shown in FIG. 3. When the value of the second voltage V2 equals the second reference value Vref2, the comparison signal Sc switches to a high value.

The quantity $\Delta T_{23}$ is the time interval between the initial instant of activation of the connection configuration II and the instant of switching to a high value of the comparison signal Sc.

As the comparison signal Sc switches to the high value, the control module 21, by performing the control law, generates the plurality of control signals Ssw, in order to drive the switching matrix 13 to the connection configuration III.

Moreover, as the comparison signal Sc switches to the high value, the control module 21 generates a comparator control signal Scomp by which, the comparison module 20 is configured for comparing the signal Vref present at the reference input 24, with the first voltage V1 available at the first input 25.

As it is apparent from the preceding description, in the connection configuration III, the comparison module 20 compares a third reference value Vref3, present at the third terminal 18, to with the first voltage V1 available at the first input 25, since the resistor r is connected to the third current generator g3, supplying an actual current I3, and the first capacitor c1 is connected to the first current generator g1 supplying an actual current I1.

The quantity $\Delta T_{31}$ indicated in FIG. 3, is the time interval from the initial instant of activation of the connection configuration III and the instant of switching to a high value of the comparison signal Sc, which occurs when the first voltage V1 equals the third reference value Vref3.

As the comparison signal Sc switches to the high value, the control module 21 drives the switching matrix 13 to the connection configuration IV through the control signals Ssw.

Moreover, as the comparison signal Sc switches to the high value, the control module 21 generates a comparator 29 control signal, Scomp, by which the comparison module 20 is configured for comparing the signal Vref present at the reference input 24, with the second voltage V2 available at the second input 26.

In the connection configuration IV, the comparison module 20 compares the third reference value Vref3 with the second voltage V2 charging the second capacitor c2.

The quantity $\Delta T_{32}$ is the time interval between the initial instant of activating the connection configuration IV and the instant of switching to a high value the comparison signal Sc, which occurs when the second voltage V2 equals the third reference value Vref3.

As the comparison signal Sc switches to the high value, the control module 21 drives the switching matrix 13 to the connection configuration V through the control signals Ssw.

Moreover, as the comparison signal Sc switches to the high value, the control module 21 generates a comparator control signal Scomp, by which the comparison module 21 is configured for comparing the signal Vref present at the reference input 24, with the first voltage V1 available at the first input 25.

In the connection configuration V, the comparison module 20 compares the second reference value Vref2 with the first voltage V1 charging the first capacitor c1.

The quantity $\Delta T_{21}$ is the time interval between the initial instant of activating the connection configuration V and the instant of switching to a high value the comparison signal Sc, which occurs when the first voltage V1 equals the second reference value Vref2.

As the comparison signal Sc switches to the high value, the control module 21 drives the switching matrix 13 in the connection configuration VI through the control signals Ssw.

Moreover, as the comparison signal Sc switches to the high value, the control module 21 to generates a comparator control signal Scomp, by which the comparison module 20 is configured for comparing the signal Vref present at the reference input 24, with the second voltage V2 available at the second input 26.

In the connection configuration VI, the comparison module 20 compares the first reference value Vref1 with the second voltage V2 charging the second capacitor c2.

The quantity $\Delta T_{13}$ is the time interval between the initial instant of activating the connection configuration VI and the instant of switching to the high value the comparison signal Sc, which occurs when the second voltage V2 equals the first reference value Vref1.

As the comparison signal Sc switches to the high value, the control module 21 drives the switching matrix 13 in the connection configuration I through the control signals Ssw.

Moreover, as the comparison signal Sc switches to the high value, the control module 21 generates a comparator control signal, Scomp, by which the comparison module 20 is configured for comparing the signal Vref present at the reference input 24, with the first voltage V1 available at the first input 25.

The sequence of connection configurations I-VI of the switching matrix 13 is iteratively and indefinitely repeated.

It is to be observed that by switching between one connection configuration and the next one, the comparison module 20 is configured in order to compare the reference signal Vref present at the reference input 24, in an alternate mode with the first voltage V1 or the second voltage V2.

According to the example described with reference to FIG. 3, the clock generation module 22 receives, at the input, the pulsed-type comparison signal Sc, schematically represented in the diagram of FIG. 3. The clock generation module 22, based on the comparison signal Sc, generates a clock signal, for example, a square-wave signal having frequency F and a corresponding period T=1/F, resulting from the sum of the time intervals $\Delta T_{12} \Delta T_{23} \Delta T_{31} \Delta T_{32} \Delta T_{21} \Delta T_{13}$ obtainable by the comparison signal Sc trend during the activation of the sequence of connection configurations I-VI.

The Applicant has observed that the oscillator circuit 1 enables generating a clock signal having a frequency F particularly accurate and reliable with reference to the undesired variations from the project nominal values induced by the process of manufacturing the oscillator circuit 1.

In fact, the possibility of selectively connecting each of the three current generators g1-g3 to the resistor r, first capacitor c1 and the second capacitor 2, underlies an offset effect resulting in a reduction of the undesired variations impact of the project nominal values, induced by the manufacturing process. Such offset effect which is completed particularly thanks to the iterated activation of the connections sequence I-VI, and the generation of a clock signal whose period T is defined as a sum of the time intervals $\Delta T_{12} \Delta T_{23} \Delta T_{31} \Delta T_{32} \Delta T_{21} \Delta T_{13}$.

In the following, it will be described how the clock signal period T is generated.

During the connection configuration I, the reference voltage Vref1, available at the third terminal 18, is expressed by the following formula:

$$V\text{ref1} = \alpha I0 R. \tag{2}$$

In the same connection configuration I, the first voltage V1 available at the first terminal 16 of the first capacitor c1, after a time charge interval $\Delta T_{12}$ is expressed in the following:

$$V1 = \beta I0 \Delta T_{12}/C. \tag{3}$$

The time interval $\Delta T_{12}$ is therefore defined by the equality: Vref1=V1

$$\Delta T_{12} = RC\, \alpha/\beta. \tag{4}$$

As it is apparent from the above described example, the further time intervals can be expressed as follows:

$$\Delta T_{23} = RC\, \beta/\delta \tag{5}$$

$$\Delta T_{31} = RC\, \delta/\alpha \tag{6}$$

$$\Delta T_{32} = RC\, \delta/\beta \tag{7}$$

$$\Delta T_{21} = RC\, \beta/\alpha \tag{8}$$

$$\Delta T_{13} = RC\, \alpha/\delta \tag{9}$$

By the equations 4-9, the period T of the clock signal CLK is given by:

$$T = \Delta T_{12} + \Delta T_{23} + \Delta T_{31} + \Delta T_{32} + \Delta T_{21} + \Delta T_{13} = = RC(6 + ( )/) = 6RC + T\epsilon \tag{10}$$

The term 6RC represents the project nominal period of the clock signal, while the term $T\epsilon$ represents the error induced by the undesired variations of the current generators behavior, due to, for example, the process of manufacturing the oscillator circuit 1 and, particularly, due to the stresses associated to the steps of applicating the packaging.

The Applicant observes that the amount of the differences between the deviation coefficients is lower than the unit, particularly, is between 0.01-0.1. By said values, it is to apparent the reducing effect due to the presence of the squared values of the differences of the deviation coefficients on the error term $T\epsilon$ of the clock period.

It is to be observed that in a conventional oscillator circuit RC, such as the circuit of the above-mentioned document US-A-2010/0013566, the generated clock period is affected by an error directly proportional to the differences between the translation coefficients, of the type $(\alpha-\beta)+(\alpha-\delta)$ and therefore certainly greater than the error $T\epsilon$ of formula (10).

Further, it is to be observed that the clock signal CLK period, expressed in formula (10), is just an example. The person skilled in the art, from the comparison signal Sc, can configure the clock generation module 21 in order to obtain clock signals having a period which is an integer multiple of the formula (10) value.

It is also possible to use sequences of connection configurations different from the one described and, for example, also generated in order to obtain a random order.

Second Embodiment

FIG. 4

Figure 4:
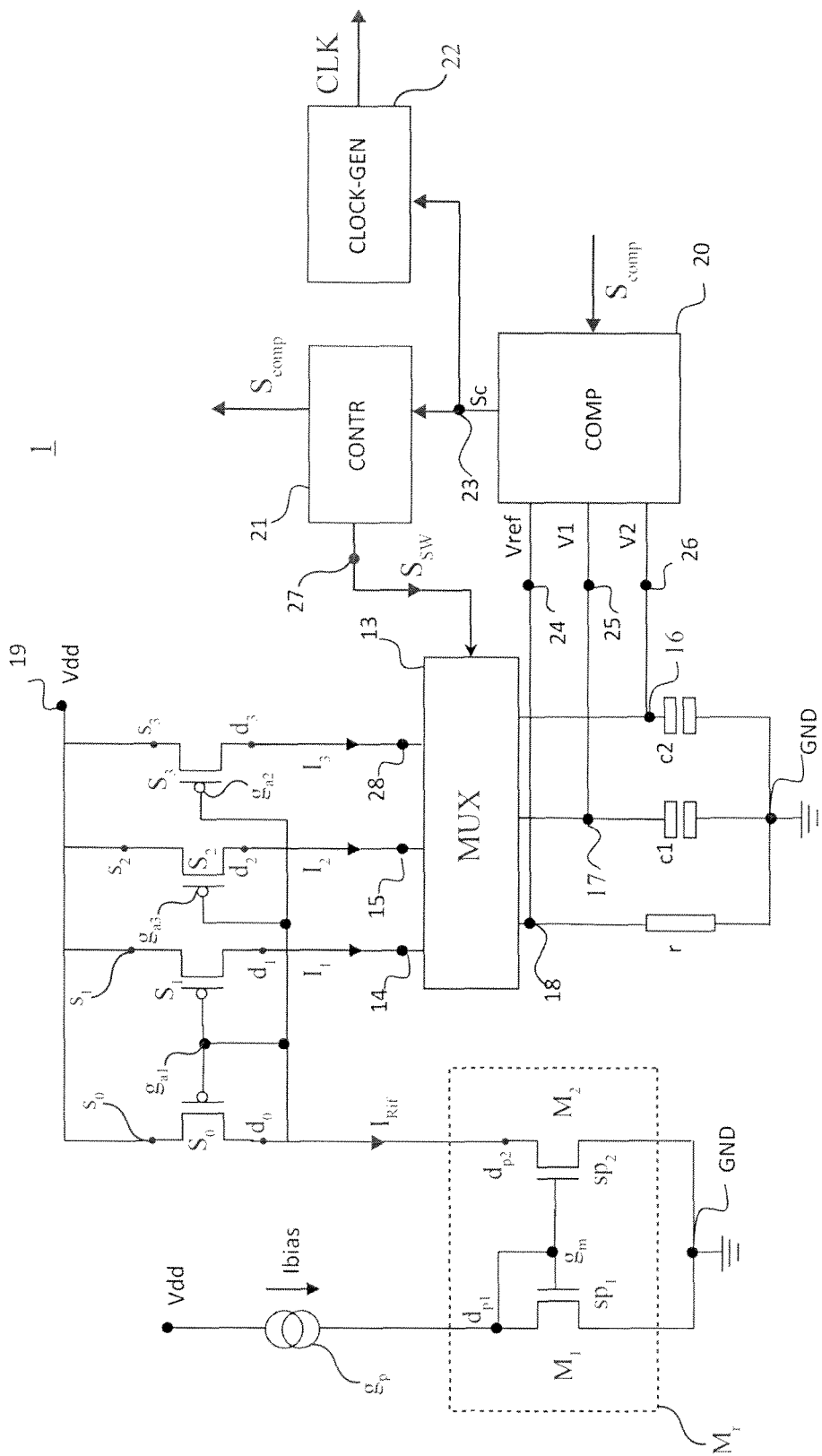
FIG. 4 shows a second embodiment of said oscillator circuit.

FIG. 4 shows a second embodiment of the oscillator circuit 1. In FIG. 4 and in the following figures, components like or similar to the ones already described are represented by like numerical references.

The oscillator circuit 1 of FIG. 4 shows a particular example of a mode implementing the generation of the first, second, and third currents I1-I3 alternative to the one shown in FIG. 2, and comprising a biasing current generator gp, adapted to generate a biasing current Ibias, and a current mirror Mr comprising a first transistor M1 and a second transistor M2, according to the n-type MOS example. The first transistor M1 comprises a corresponding drain terminal dp1 connected to the output of the biasing generator gp for receiving the biasing current Ibias, and a respective generator terminal sp1 connected to the ground terminal gnd. A gate terminal gM of the first transistor M1 is short-circuited to the respective drain terminal dp1, and to the homonymous gate terminal of the second transistor M2.

A generator terminal sp2 of the second transistor M2 is connected to the ground terminal gnd, while a corresponding drain terminal dp2 is connected to a drain terminal d0 of a reference transistor S0.

The current minor Mr is configured so that to supply at the drain terminal dp2 of the second transistor M2 a current Irif proportional to the biasing current Ibias, according to a scale factor typical of the current minor Mr.

The oscillator circuit 1 of FIG. 4 further comprises a first current minor formed by the reference transistor S0 and by a first generator transistor S1. According to this specific example, the reference transistor S0 and the first generator transistor S1 are both of the p-MOS type.

A generator terminal s0 of the reference transistor S0 and a generator terminal s1 of the first generator transistor S1, are connected to the supply terminal 19, for receiving the supply voltage Vdd. Gate terminals ga1 of the reference transistor S0 and of the first generator transistor S1 are connected to the drain terminal d0 of the reference transistor S0.

A drain terminal d1 of the first generator transistor S1 is connected to the first connection terminal 14 of the switching matrix 13.

The first generator transistor S1 is configured for supplying at its own drain terminal d1, the first actual current I1 proportional to the reference current Irif, according to scale factor $\alpha'=I1/Irif$, typical of the first current mirror (S0-S1).

The oscillator circuit 1 of FIG. 4 further comprises a second current minor formed by the reference transistor S0 and a second generator transistor S2 (for example of the p-MOS type).

A generator terminal s2 of the second generator transistor S2, is connected to the supply terminal 19, for receiving the supply voltage Vdd. A gate terminal ga2 of the second generator transistor S2 is connected to the drain terminal d0 of the first reference transistor S0.

A drain terminal d2 of the second generator transistor S2 is connected to a second connection terminal 15 of the switching matrix 13. The second generator transistor S2 is configured for supplying, at its own drain terminal d2, the second actual current I2 proportional to the reference current Irif, according to a scale factor $\beta'=I2/Irif$ typical of the second current mirror (S0-S2).

In addition, the oscillator circuit 1 of FIG. 4 comprises a third current mirror formed by the reference transistor S0 and a third generator transistor S3 (for example of the p-MOS type).

A generator terminal s3 of the third generator transistor S3 is connected to the supply terminal 19, for receiving the supply voltage Vdd. A gate terminal ga3 of the third generator transistor S2 is connected to the drain terminal d0 of the reference transistor S0.

A drain terminal d3 of the third generator transistor S3 is connected to the third connection terminal 28 of the switching matrix 13.

The third generator transistor S3 is configured for supplying, at its own drain terminal d3, the third actual current I3 proportional to the reference current Irif, according to a scale factor $\delta'=I3/Irif$ typical of the third current mirror (S0-S3).

Operation of the Oscillator Circuit 1 of FIG. 4

The operation of the oscillator circuit 1 of FIG. 4 is analogous to the one described with reference to the first embodiment, and particularly the same formulas (2)-(10) hold by substituting the deviation coefficients α, β, δ, with the scale factors α', β', δ', respectively. In particular, formula 10 can be rewritten as follows:

$$T=RC(6+( )/)=6RC+T\epsilon' \qquad (10')$$

From formula (10'), it is possible to infer, according to this second embodiment, that the term $T\epsilon'$ represents the error induced by the undesired variations of the behavior of transistors M1-M2, S0-S3 forming the current mirror supplying the actual currents I1-I3, due to, for example, the process of manufacturing the oscillator circuit.

Particularly, the undesired variations induced by the manufacturing process appear as reciprocally different scale factors α', β', δ'. The Applicant observes that the amount of the differences between the scale factors is less than the unit, in particular it is comprised between 0.01-0.1. Due to the advantages of the second embodiment, comments and considerations analogous to the ones of the first embodiment hold.

Third Embodiment

FIG. 5

Figure 5:
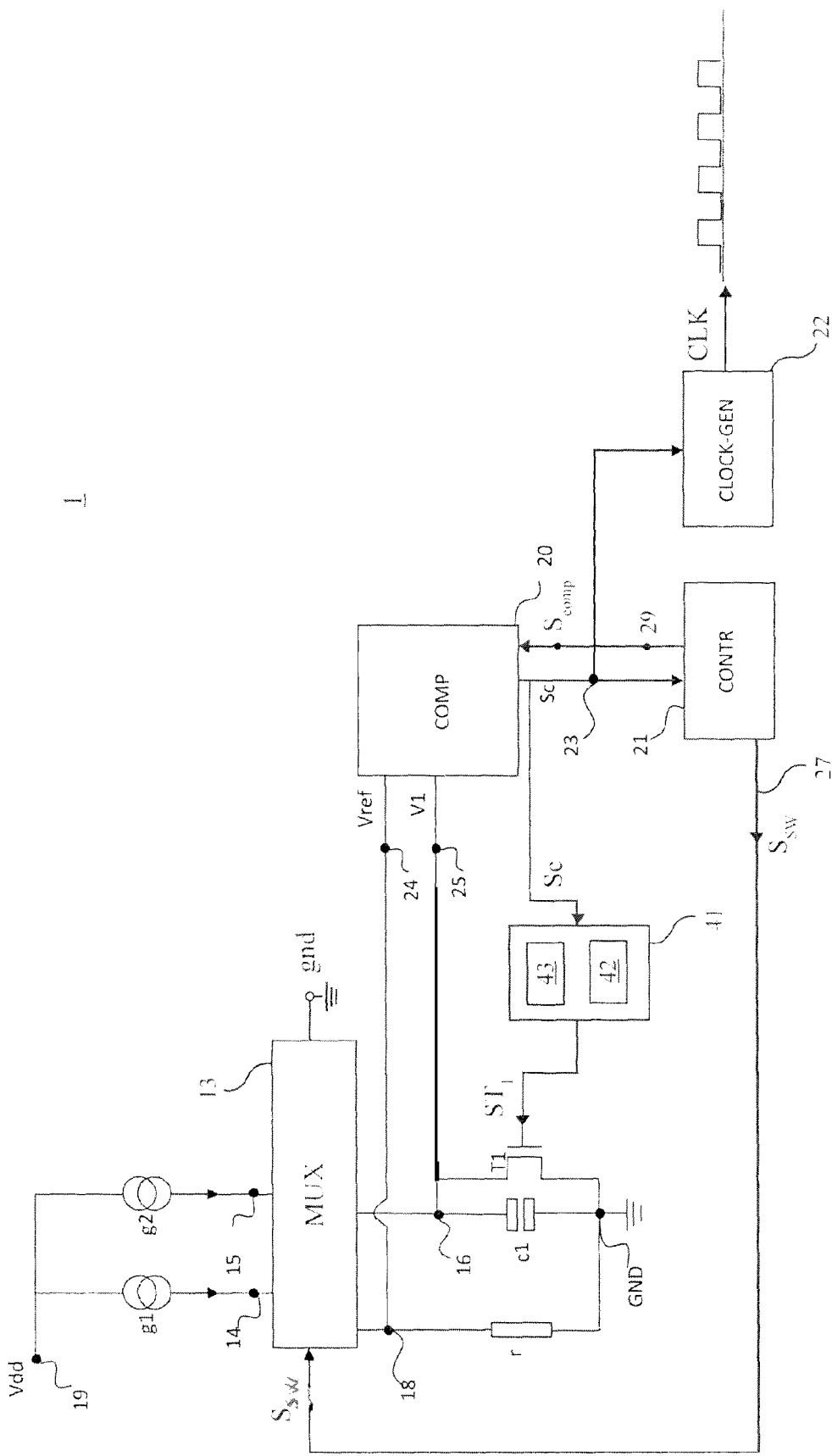
FIG. 5 shows a third embodiment of said oscillator circuit.

In FIG. 5, it is schematically shown a third embodiment of the oscillator circuit 1, analogous to the one of FIG. 2.

The oscillator circuit 1 of FIG. 5, unlike the one of FIG. 1, is not provided with the second capacitor c2, and the third current source g3, and comprises a further control module 41 configured for supplying the first control signal ST1 of the first discharge transistor T1, from the comparison signal Sc.

According to a non-limiting example, the further control module 41 comprises a delay element 42, for example of the analog type, adapted to delay by δτ a reproduction of the comparison signal Sc, by generating a corresponding delayed comparison signal Scd, and further comprises a logic module 43 made up by suitable combinatorial and sequential logic circuits.

According to this third embodiment, the switching matrix 13 is configured for selectively connecting the first connection terminal 14 to the first 16 and third terminal 18; further, the switching matrix 13 enables to selectively connect the second connection terminal 15 to the first 16 and third terminal 18.

Figure 6:
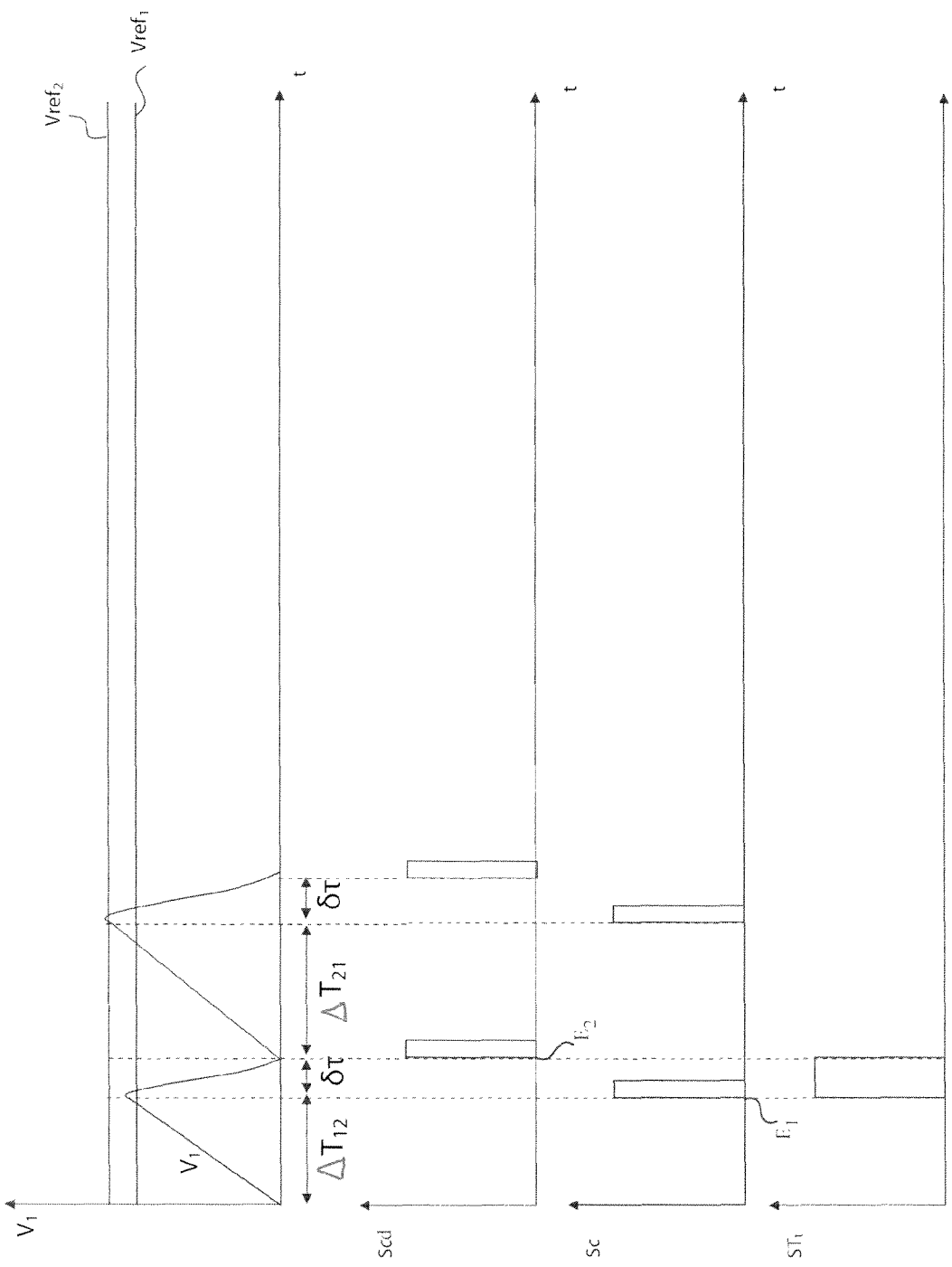
FIG. 6 shows an exemplifying trend of some signals of a second embodiment of said oscillator circuit.

In the following, an operative example of the oscillator circuit 1 of FIG. 5 will be described, with reference to FIG. 6.

In a first step, the first current generator g1 is connected to the third terminal 18 of the resistor r; the second generator g2 is connected to the first terminal 16 of the first capacitor c1 which charges. During the first step, the resistor r, being connected to the current generator g1 generating an actual current I1, develops a voltage at the third terminal 18 equal to Vref1. In this first configuration, the second current generator g2 supplies the first capacitor c1, which charges by taking a first voltage V1 available at the first terminal 16 having an increasing trend according to this example.

Further, in this first step, the comparison module 20 compares the first reference value Vref1 and the first voltage V1 and gives back the comparison signal Sc.

As long as the value of the first voltage V1 is lower than the first reference value Vref1, the comparator returns a comparison signal Sc having a low value. When the value of the first voltage V1 equals the first reference value Vref1, the comparison signal Sc switches to a high value.

The quantity $\Delta T_{12}$ is the time range between the initial instant of implementing the first step and the instant of switching the comparison signal Sc.

It is to be observed that during this first step, the control signal ST1 has a high value which puts the first discharge transistor T1 in an opening state.

In a second step, the discharge of the first capacitor c1 is performed. The first discharge transistor T1 is closed for a time δτ to enable to discharge the charge formed during the first step of the first capacitor c1. The closure of the first discharge transistor T1 for a time δτ occurs by piloting the corresponding gate terminal by the first control signal ST1 generated by the further control module 41.

With reference to the generation of the first control signal ST1 (see FIG. 5 and also FIG. 6), the logic module 43, based on the comparison signal Sc and the delayed comparison signal Scd, generates the first control signal ST1 showing the shape of a pulse with a high logic level having a duration equal to δτ, between the time instants E1, E2: E1 corresponding to the leading edge of the comparison signal Sc, and E2 corresponding to the leading edge of the delayed comparison signal Scd. Therefore, the discharge of the first capacitor c1 occurs in a time range δτ.

In the same second step, the first current generator g1 is connected to the first terminal 16 to of the first capacitor c1, which starts to charge after the discharge time range δτ; the second generator g2 is connected to the third terminal 18 of the resistor r.

During this second step, the resistor r being connected to the second current generator g2 generating an actual current I2, develops a voltage at the third terminal 18 equal to Vref2. In this second step, the first current generator g1 supplies the first capacitor c1 which, after a discharge time range δτ (which is assumed to be equal to the preceding discharge time range), charges by taking a first voltage V1 available at the first terminal 16 having an increasing trend according to this example.

The quantity $\Delta T_{21}$ is the time range between the instant in which the first capacitor c1 starts to charge (δτ seconds after the instant in which the second step is performed) and the instant wherein the comparison signal Sc switches, when the first voltage V1 equals the first reference value Vref1.

The sequence by which the first step and the second step are performed, is iteratively and indefinitely repeated.

According to this third embodiment of the oscillator circuit 1, the clock generation module 22, based on the comparison signal Sc, generates a pulsed clock signal CLK, for example, a square wave signal, having a period T defined as a sum of two time ranges. A first time range t1, equal to the time between a first leading edge of the comparison signal Sc and a second edge (following the first one), having a duration equal to $t1=\Delta T_{12}+\delta\tau$. The second time range t2, is the time between the second leading edge (after the first one) of the comparison signal Sc, and a third leading edge (after the second) having a duration equal to $t2=\Delta T_{21}+\delta\tau$, as shown in FIG. 6.

Based on the time ranges t1, t2, the period T of the clock signal CLK is given by the following formula:

$$T=t1+t2=\Delta T_{12}+\delta\tau+\Delta T_{21}+\delta\tau \qquad (11)$$

Analogously to what has been described with reference to the first embodiment of the oscillator circuit 1, it is found that the period T of the clock signal is equal to:

$$T=RC(2+(\alpha-\beta)^2/(\alpha\beta))+2\delta\tau \quad (12)$$

$$T=2RC+T\epsilon+2\delta\tau \quad (13)$$

The term 2RC represents the project nominal period of the clock signal, while the term T∈ represents the error induced by the undesired variations of the behavior of the current generators due to, for example, the process of manufacturing the oscillator circuit 1. Analogously to what has been described with reference to the first embodiment of the oscillator circuit 1, based on said values, it is apparent in formulas (12), (13), the reduction effect due to the presence of squared values of the differences of the translation coefficients on the error term T∈ of the clock period.

It is to be observed that in this third embodiment of the oscillator circuit 1, the term 2δτ induced by the discharge process of the first capacitor c1, results in an undesired translation term with respect to the project nominal period of the clock signal CLK. The Applicant has observed that such term 2δτ is, in several applications, negligible with respect to the error term value T∈.

Moreover, it is to be observed that the clock signal CLK period expressed by formula (11) is just an example. The person skilled in the art, from the comparison signal, can configure the clock generation module 21 in order to obtain clock signals having a period integer multiple of the value t1+t2.

First Example of the Comparison Module 20

Figure 7:
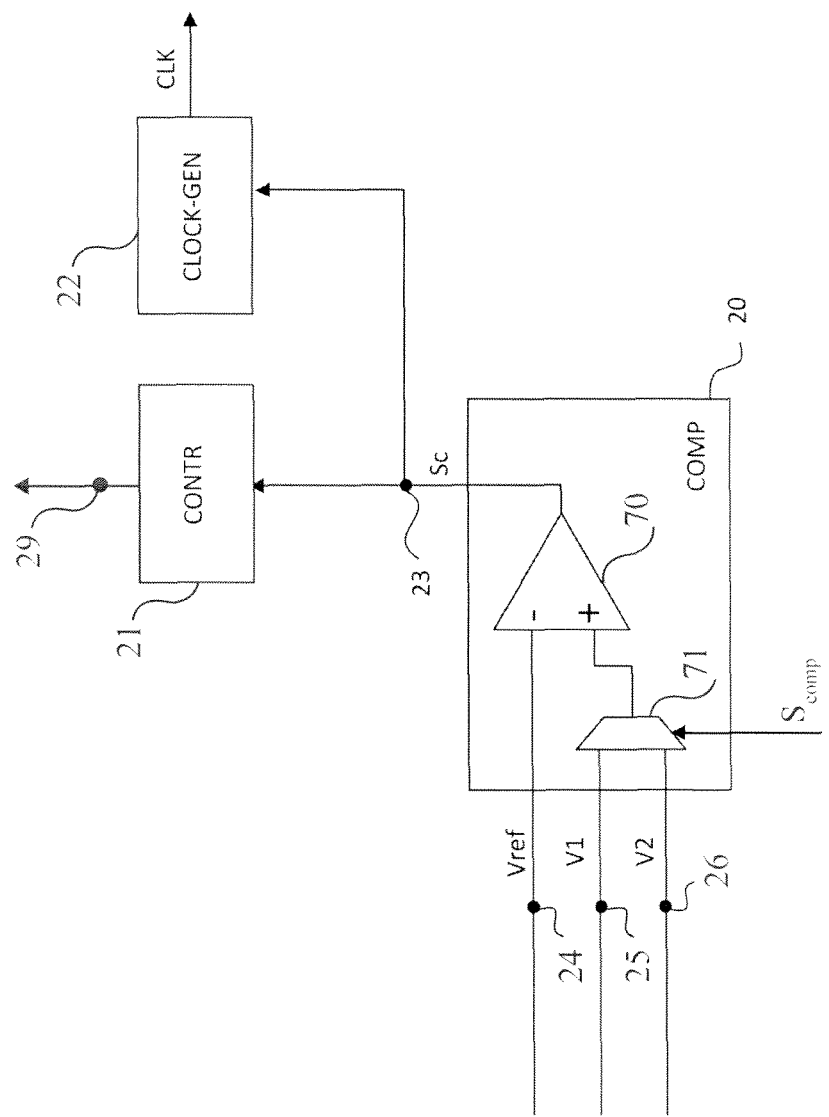
FIG. 7 shows a first example of an embodiment of a comparison module embedded in the oscillator circuit according to the first embodiment of said circuit.

FIG. 7 shows a first example of embodiment of the comparison module 20, comprising a comparator 70 provided with an output connected to the output 23 of the comparison module 20, and an inverting terminal (−) connected to the reference input 24. The comparator 70 further comprises a non-inverting terminal (+) connected to an output of a multiplexer module 71, having a first input port connected to the first input 25, a second input port connected to the second input 26, and a selection input for receiving a control signal of the comparator, for example a binary type signal, Scomp, generated by the control module 21. The comparator 70 is for example formed by operational amplifiers.

By the control signal value of the comparator Scomp, the multiplexer module 71 selects just one between the first input 25 and the second input 26 and respectively transfers the first voltage V1 or the second voltage V2 at the non-inverting input of the comparator 70. Based on the value of the comparator control signal Scomp, the comparator 70 compares the reference voltage Vref with the first one V1 or the second voltage V2, by generating, at the output 23 of the comparison module, the comparison signal Sc.

Second Example of the Comparison Module 20

Figure 8:
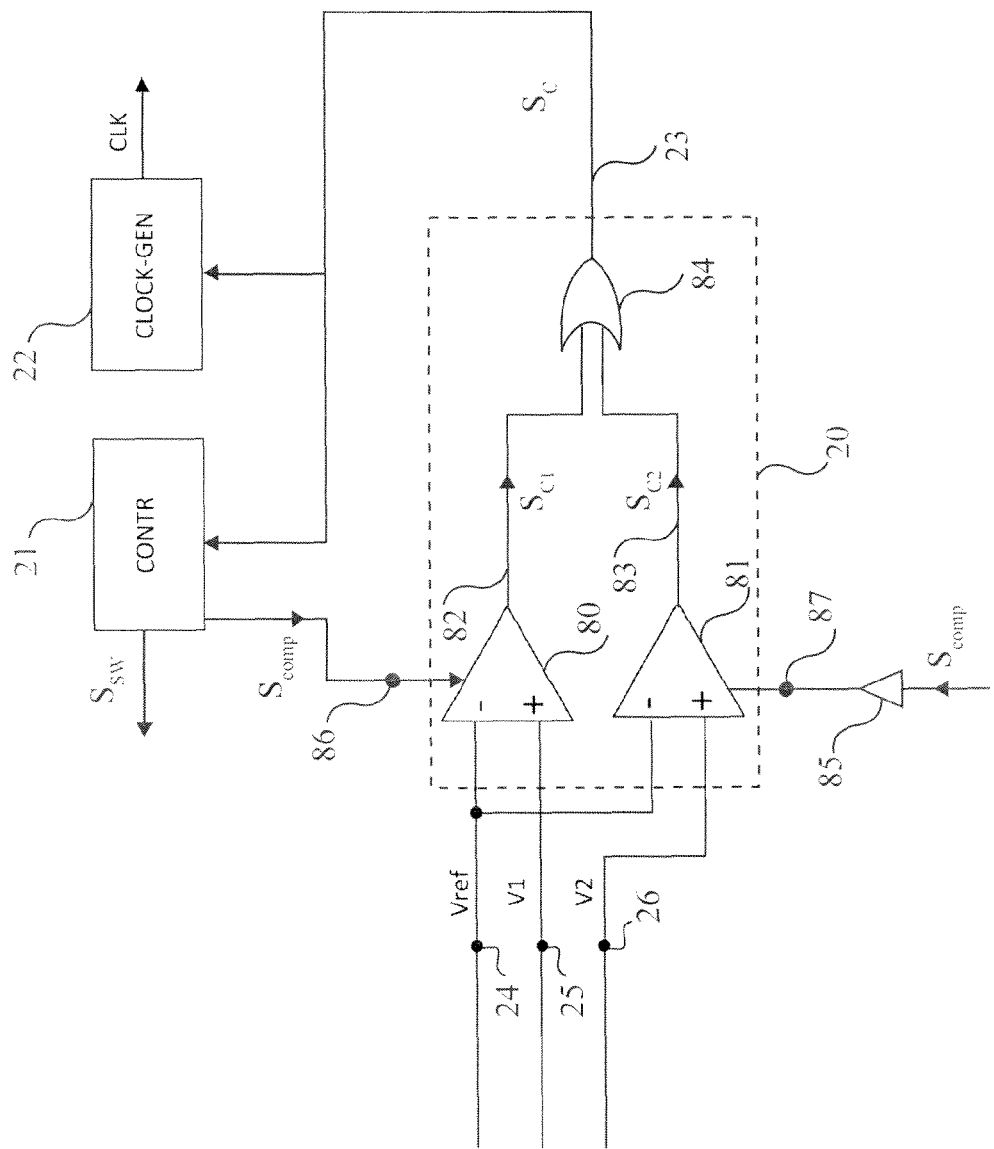
FIG. 8 shows a second example of an embodiment of the comparison module embedded in the oscillator circuit according to the first embodiment.

FIG. 8 shows a second example of embodiment of the comparison module 20, comprising a first comparator 80 and a second comparator 81, both implementable by operational amplifiers.

The first comparator 80 is provided with a respective inverting terminal "−" connected, for example, to the reference input 24, for receiving the reference voltage Vref and the respective non inverting input "+" connected to the first input 25 for receiving the first voltage V1.

The second comparator 81 is provided with a corresponding inverting terminal "−" connected, for example, to the reference input 24, for receiving the reference voltage Vref, and a corresponding non inverting input "+" connected to the second input 26 for receiving the second voltage V2.

Further, the first comparator 80 comprises a first comparison output 82 for a first comparison signal Sc1 and the second comparator 81 comprises a second comparison output 83 for a second comparison signal Sc2.

The comparison module 20 further comprises a combining logic element 84, such as a logic port NOR, configured for receiving at the input, the first and second comparison signals, Sc1 and Sc2, and for supplying, at the output terminal 23, the comparison signal Sc, obtained by combining, particularly of the OR type, the signals at the input of the combination element 84.

According to the example shown in FIG. 8, the first comparator 80 is provided with a first enabling input 86 adapted to receive a first enabling/disabling signal coinciding with, in the example, the comparator control signal Scomp, provided by the control module 21. The second comparator 81 is provided with a second enabling input 87 adapted to receive a second enabling/disabling signal coinciding, in the example, with a negated reproduction (obtainable by a logic port NOT 85) of the comparator control signal Scomp.

During the operation of the comparison module 20 of FIG. 8, based on the comparator control signal value Scomp, it is enabled to operate just one comparator at a time of the first and the second comparators 80 and 81, by generating the first or second comparison signal Sc1 or Sc2. The first comparator 80 is disabled during the discharge of the first capacitor c1 and, at the same time, the second comparator 81 is enabled to operate because the second capacitor c2 is charged and vice versa.

Both the first and second comparison signals Sc1 and Sc2 are, for example, low level voltage signals if the reference signal Vref has a value greater than the signal to be compared, and take a high level if the reference signal Vref has a value equal to or lower than the signal to be compared.

According to an alternative embodiment, not shown, the combination element 84 is not provided, and the first and second comparison signals Sc1 and Sc2 can be provided separately to the control module 21 and/or to the clock generation module 22, which will combine and process them according to modes analogue to the above described ones.

Third Example of the Comparison Module 20

Figure 9:
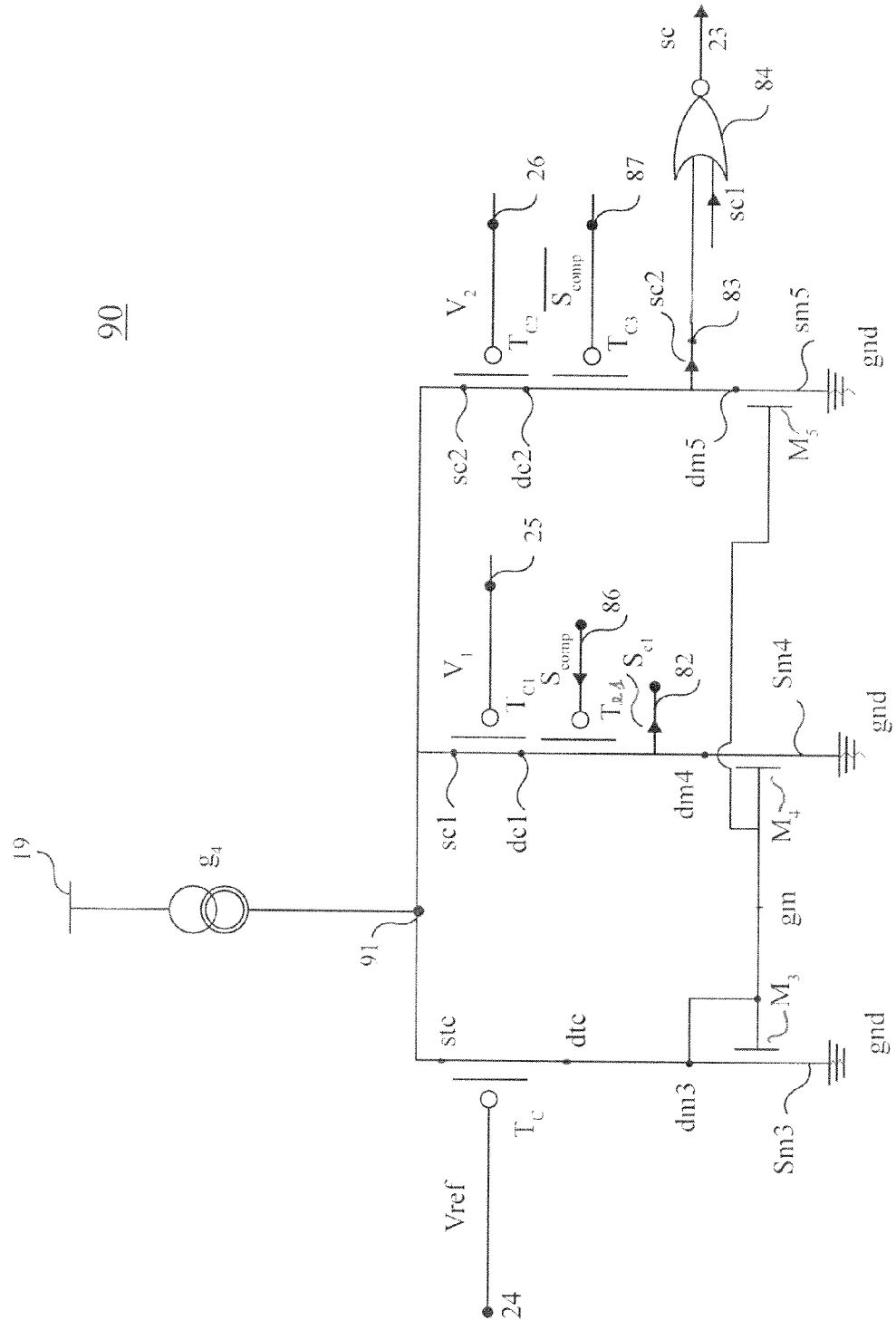
FIG. 9 shows a third example of an embodiment of the comparison module embedded in the oscillator circuit according to the first embodiment.

FIG. 9 shows an embodiment of a comparison circuit 90 adapted to implement the comparison module 20 according to a third example.

The comparison circuit 90 comprises a current source g4 and a plurality of transistors (for example of the P-MOS type) comprising: a reference transistor Tc having the corresponding gate terminal connected to the reference input 24 for receiving the reference voltage Vref, a first comparison transistor Tc1 and a second comparison transistor Tc2. The first comparison transistor Tc1 has the corresponding gate terminal connected to the first input terminal 25 for receiving the first voltage V1. The second comparison transistor Tc2 comprises a corresponding gate terminal connected to the second input terminal 26 for receiving the second voltage V2.

More particularly, the current generator g4 is connected between the supply terminal 19 and a supply terminal 91. The reference transistor Tc comprises a corresponding generator terminal stc connected to the supply terminal 91 and a corresponding drain terminal dtc connected to the drain terminal dm3 of a third transistor M3, included in a current mirror comprising also a fourth transistor M4.

The third transistor M3 (for example, of the P-MOS type) has its drain terminal dm3 connected to its gate terminal gm and a corresponding generator terminal sm3 connected to the ground terminal gnd.

The first comparison transistor Tc1 comprises a corresponding generator terminal sc1 connected to the supply terminal 91 and a corresponding drain terminal dc1 connected to a drain terminal of a first enabling transistor Te1 (for example, of the P-MOS type), having its generator terminal connected to a drain terminal dm4 of the fourth transistor M4. A gate terminal of the fourth transistor M4 is common to the gate terminal gm of the third transistor M3 and a generator terminal sm4 of the fourth transistor M4 is connected to the ground terminal gnd.

A gate terminal of the first enabling transistor Te1 is connected to the first enabling input 86 for receiving the comparator control signal, Scomp. Between the drain terminal of the first to enabling transistor Te1 and the drain terminal dm4 of the fourth transistor M4 is connected the first comparison output 82 for the first comparison signal Sc1.

The second comparison transistor Tc2 comprises a corresponding generator terminal sc2 connected to the supply terminal 91 and a corresponding drain terminal dc2 connected to a drain terminal of a second enabling transistor Te2 (for example, of the P-MOS type), having its generator terminal connected to a drain terminal dm5 of a fifth transistor M5. A gate terminal of the fifth transistor M5 is common to the gate terminal gm of the third transistor M3 and a generator terminal sm5 of the fifth transistor M5 is connected to the ground terminal gnd. The third transistor M3 and the fifth transistor M5 form a corresponding current mirror.

A gate terminal of the second enabling transistor Te2 is connected to the second enabling input 87 for receiving, according to this example, the negated reproduction of the comparator control signal, Scomp. Between the drain terminal of the second enabling transistor Te2 and the drain terminal dm5 of the fifth transistor M5 is connected the second comparison output 83 for the second comparison signal Sc2.

The first enabling transistor Te1 enables to enable/disable the comparison between the first voltage V1 and the reference voltage Vref; while the second enabling transistor Te2 enables to enable/disable the comparison between the second voltage V2 and the reference voltage Vref.

With reference to the operation of the comparison circuit 90, it is considered a configuration (for example the above described configuration I) wherein the first capacitor c1 charges. In such configuration I, the first enabling transistor Te1 is in a closed state (that is, it is conducting) while the second enabling transistor Te2 is in an opening state (it is not conducting). In this configuration, the comparison circuit 90 takes the configuration of a differential amplifier which operates by amplifying (for example, with a gain much greater than 1) the difference between the reference voltage Vref and the first voltage V1. The comparison circuit 90 can be sized in order to supply a low value of the first comparison signal Sc1 as long as the first voltage is less than the reference voltage Vref.

During the charging of the second capacitor c2, the comparison circuit 90 takes the configuration of a differential amplifier which operates by amplifying the difference between the reference voltage Vref and the second voltage V1.

Figure 10:
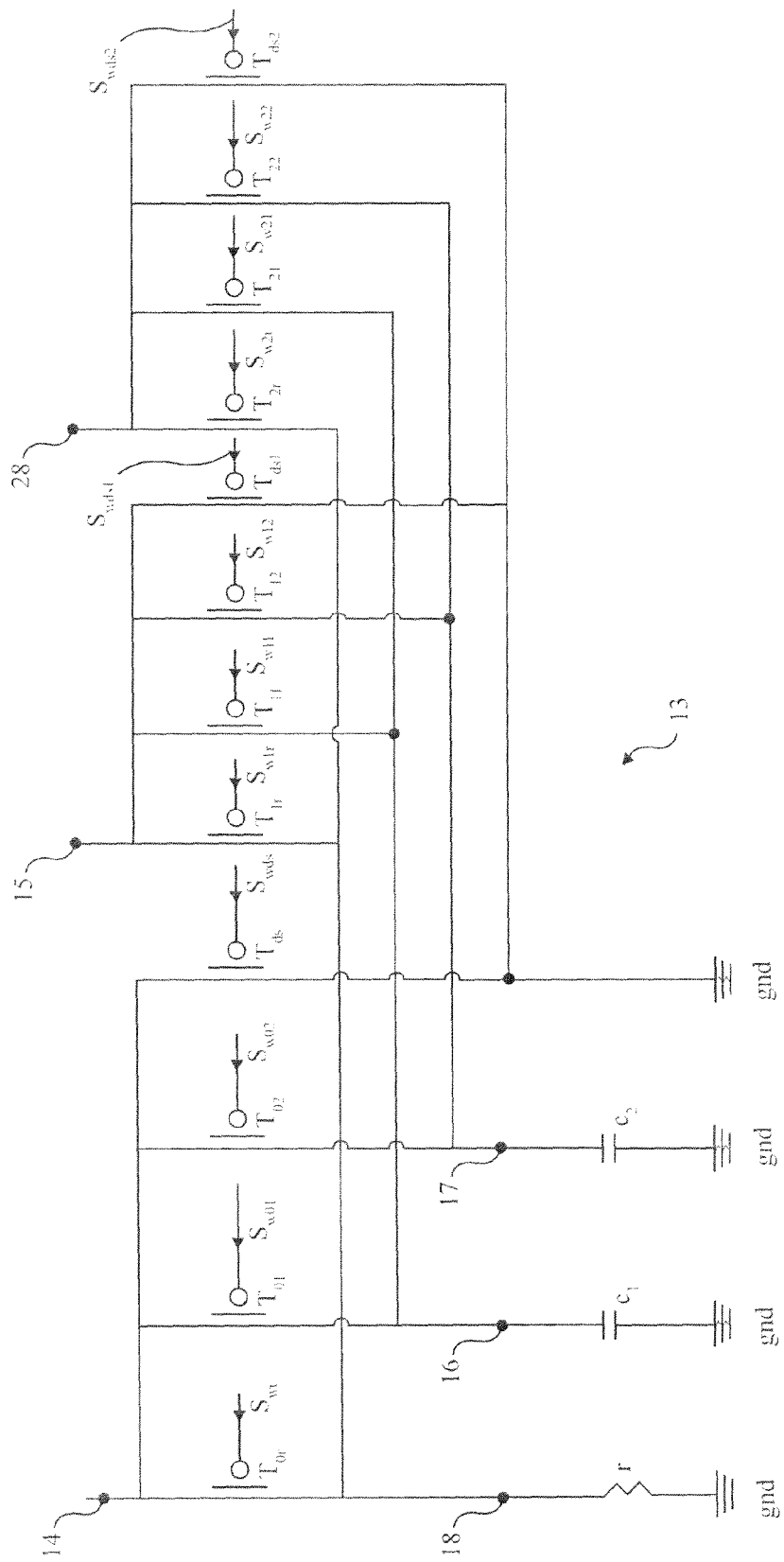
FIG. 10 shows an embodiment of a switching matrix useable in the first and second embodiments of said oscillator circuit.

Example of a Switching Matrix (FIG. 10)

FIG. 10 shows a particular embodiment of the switching matrix 13 usable in the oscillator circuit 1 of FIGS. 2 and 4.

The switching matrix 13 comprises a first plurality of switches, a second plurality of switches, and a third plurality of switches connected to the inputs and generates of the matrix itself.

For example, the first plurality of switches comprises a first plurality of switching transistors T0r, T01 and T02 (for example of the P-MOS type) each respectively connected between the connection terminal 14 and the third terminal 18, the first terminal 16 and the second terminal 17. The first connection terminal 14 is also connected to a ground transistor Tds also connected to the ground terminal gnd.

Moreover, the second plurality of switches comprises a second plurality of switching transistors T1r, T11 and T12 (for example of the P-MOS type) each respectively connected between the second connection terminal 15 and the third terminal 18, the first terminal 16 and the second terminal 17. The second connection terminal 15 is also connected to a first ground transistor Tds1 also connected to the ground terminal gnd.

The third plurality of switches comprises a third plurality of switching transistors T2r, T21 and T22 (for example of the P-MOS type) each respectively connected between the third connection terminal 28 and the third terminal 18, the first terminal 16 and the second terminal 17. The third connection terminal 28 is also connected to a second ground transistor Tds2 also connected to the ground terminal gnd.

Each switching transistor T0r, T01 and T02, T1r, T11 and T12 and T2r, T21 and T22 is enableable/disableable to/from operating by a corresponding control signal Sw0r, Sw01, Sw02, Swds, Sw1r, Sw11, Sw12, Swds1, Sw2r, Sw21, Sw22, Swds2 applied to the corresponding gate terminal and included in the plurality of control signals Ssw, generated by the control module 21, so that the switching matrix 13 can take each of the above mentioned configurations I-VI or other configurations.

The ground transistor Tds, first ground transistor Tds1 and second ground transistor Tds2 enable to connect to the ground terminal gnd selectively the first, second and third connection terminals 14, 15 and 28 which is not intended to be connected to anyone between the first, second and third terminals 16, 28 and 18, depending on the particular connection configuration to be taken.

By using only the first plurality of switches and second plurality of switches, the switching matrix 13 of FIG. 10 is usable also in the oscillator circuit of FIG. 5.

A Further Embodiment

According to a further embodiment of the oscillator circuit 1, it is possible to use more than three capacitors and/or more than two, particularly more than three current generators. The number of capacitors is indicated by Nc in the following, while the number of current generators is indicated by Ns.

The switching matrix 13 comprises a number Mc of switches connecting the Ns current generators to the resistor r, the ground terminal gnd and the Nc capacitors present in the oscillator circuit, equal to:

$$Mc=(Nc+2)Ns.$$

According to this further embodiment, the comparison module 20 is adapted to compare the reference voltage Vref also with the charging voltages of the Nc capacitors.

The clock signal CLK has a period given by the sum of a number Ni of time ranges equal to Ns!/(Bs-2)!, wherein the mark "!" is the factorial operation.

The described embodiments of the oscillator circuit 1 enable to reduce, with respect to the known oscillators RC, an undesired frequency shift with respect to the project nominal value and the generated clock signal. Such frequency shift is induced, for example, by the stresses associated to the application of the package to the integrated oscillator circuit.

It is to be observed that the use of a reference voltage Vref drawn at the third terminal 18 of the resistor r enables to reduce the frequency shift of the clock signal CLK associated with undesired variations of the supply voltage Vdd.

The person skilled in the art in order to meet specific contingent needs, can introduce several modifications, substitutions or changes of elements with other operatively equivalent ones to the above described embodiments of the electronic system 100 and oscillator circuit without falling out of the scope of the attached claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Oscillator circuit comprising:
at least one first capacitor provided with a first terminal;
a resistor provided with a reference terminal;
a first current source provided with a connection terminal;
a second current source provided with a second connection terminal;
a switching matrix interposed between the first and second source and the resistor and the at least one first capacitor and configured to selectively connect each between the first and second connection terminals to the first terminal and to the reference terminal.

2. Oscillator circuit according to claim 1, further comprising:
a comparison module configured to compare a reference signal available at the reference terminal with a charging signal available at the first terminal and supplying a comparison signal.

3. Oscillator circuit according to claim 2, further comprising:
a control module of the switching matrix configured to provide a plurality of control signals and to perform a plurality of connection configurations between the first and second current sources and the resistor and said at least one first capacitor, according to a timing clocked by the comparing signal.

4. Oscillator circuit according to claim 3, further comprising:
a second capacitor provided with a second terminal;
a third current source provided with a third connection terminal connected to the switching matrix, said switching matrix being configured to:
selectively connect the third connection terminal to the first and second connection terminals and to the reference terminal dependent on the plurality of control signals.

5. Oscillator circuit according to claim 4, wherein said comparison module is configured to:
compare the reference signal available at the reference terminal with a charging signal selectively available at the first terminal and at the second terminal and supplying the comparison signal.

6. Oscillator circuit according to claim 4, further comprising:

a clock generation module configured to generate, starting from said comparison signal, a clock signal having a period multiple of a first period of the comparison signal.

7. Oscillator circuit according to claim 6, wherein the control module and the comparison module are configured to supply the comparison signal having the first period dependent on a first time interval associated with a first charging step of the first capacitor by the first current source, a second time interval associated to a second discharging step of the first capacitor and a third time interval associated to a third charging step of the first capacitor by the second current source.

8. Oscillator circuit according to claim 6, wherein the control module is configured to generate the plurality of control signals of the switching matrix such to set at least three charging steps of the first capacitor alternated with at least three charging steps of the second capacitor, and wherein:
said at least three charging steps of the first capacitor being alternatively performed by the first current source, second current source, and third current source;
said at least three charging steps of the second capacitor being alternatively performed by the first current source, second current source and third current source.

9. Oscillator circuit according to claim 8, wherein the clock generation module is configured to generate, starting from said comparison signal, the clock signal having a corresponding period dependent on at least three first time intervals associated with the three charging steps of the first capacitor and at least three first time intervals associated with the at least three charging steps of the second capacitor.

10. Oscillator circuit according to claim 5, wherein said comparison module comprises:
a comparator having a first input connected to the reference terminal and a second input;
a multiplexer having a first input port connected to the first terminal, a second input port connected to the second terminal and an output port connected to the second input of the comparator; the multiplexer being configured to selectively transferring to the output port a first charging signal available at the first terminal and a second charging signal available at the second terminal, dependent on a control signal of the comparator generable by the control module.

11. Oscillator circuit according to claim 5, wherein said comparison module comprises:
a first comparator having a reference input connected to the reference terminal and a first comparison input connected to the first terminal;
a second comparator having a further reference input connected to the reference terminal and a second comparison input connected to a second terminal;
wherein the operations of the first and second comparators can be alternatively enabled/disabled as a function of a corresponding comparator-control signal generable by the control module.

12. Oscillator circuit according to claim 1, wherein the first and second sources are provided by current mirror circuits comprising MOSFET transistors.

13. Oscillator circuit according to claim 1, wherein the switching matrix comprises:
a first plurality of selection transistors connected between the first connection terminal and the first terminal, the second terminal and the reference terminal;
a second plurality of selection transistors connected between the second connection terminal and the first terminal, the second terminal and the reference terminal.

14. Oscillator circuit according to claim 4, wherein said circuit is integrated in a chip made of a semiconductor material and is provided with a package.

15. Oscillator circuit according to claim 1, wherein the first source is adapted to generate a first current subjected to first undesired variations with respect to a first nominal value, associated with a circuit manufacturing process, and the second current source is adapted to generate a second current, subjected to second undesired variations with respect to a second nominal value, associated to the circuit manufacturing process; said first and second undesired variations having the same order of magnitude.

16. Electronic system comprising:
a computer electronic module;
an oscillator circuit according to claim 1, connected to the computer electronic module for providing a timing signal.

* * * * *

UNITED STATES PATENT AND TRADEMARK OFFICE
CERTIFICATE OF CORRECTION

| | | |
|---|---|---|
| PATENT NO. | : 8,860,517 B2 | Page 1 of 1 |
| APPLICATION NO. | : 13/524510 | |
| DATED | : October 14, 2014 | |
| INVENTOR(S) | : Giacomini | |

It is certified that error appears in the above-identified patent and that said Letters Patent is hereby corrected as shown below:

In the Claims

Column 18, Line 40    Delete: "selectively transferring"
                     Insert: --selectively transfer--

Signed and Sealed this
Fourteenth Day of July, 2015

Michelle K. Lee
*Director of the United States Patent and Trademark Office*